United States Patent
Baik

[19]

[11] Patent Number: 6,101,091
[45] Date of Patent: Aug. 8, 2000

[54] CLIP FOR CLAMPING HEAT SINK AND SEMICONDUCTOR

[75] Inventor: Woon Hak Baik, Seoul, Rep. of Korea

[73] Assignee: Orient Co., Ltd., Rep. of Korea

[21] Appl. No.: 09/224,197

[22] Filed: Dec. 30, 1998

[51] Int. Cl.[7] ...................................................... H05K 7/20
[52] U.S. Cl. ............................ 361/704; 24/626; 257/727
[58] Field of Search ................................. 165/80.3, 185; 174/16.3; 267/150, 158, 160; 411/352; 248/296, 316.7, 505, 510; 24/453, 457, 458, 473, 625, 295, 626, 296; 257/718, 719, 726, 727; 361/704, 707, 709, 718, 719, 722

[56] References Cited

U.S. PATENT DOCUMENTS

| | | |
|---|---|---|
| 4,716,494 | 12/1987 | Bright . |
| 4,719,540 | 1/1988 | San George . |
| 5,208,731 | 5/1993 | Blomquist . |
| 5,448,449 | 9/1995 | Bright . |
| 5,678,627 | 10/1997 | Lee . |
| 5,684,676 | 11/1997 | Lin . |
| 5,699,229 | 12/1997 | Brownell . |
| 5,995,369 | 11/1999 | Kiermeier . |
| 5,999,402 | 12/1999 | Jeffries . |

*Primary Examiner*—Gerald Tolin
*Attorney, Agent, or Firm*—Webb Ziesenheim Logsdon Orkin & Hanson, P.C.

[57] ABSTRACT

A clip for clamping a heat sink and a semiconductor chip together on a main board of a computer is disclosed, in which a semiconductor chip such as a CPU of a computer is coupled with a heat sink by means of the clamping clip, for releasing the generated heat of the semiconductor chip. Particularly, a clip for clamping a heat sink and a semiconductor chip together on a main board of a computer is disclosed, in which a fixing clip having left and right bent segments is used, and the heat sink is elastically fixed to the main board of a computer by means of the clamping clip, so that an external impact cannot cause the heat sink to detach from the main board of the computer. Thus a single clip is used in elastically fixing the heat sink and the semiconductor chip to the main board in an easy manner, that is, four pins protruding to under the bottom of the main board are fixed by means of a single clip, thereby realizing a sure and firm fixing. The clip can be assembled or disassembled to or from the securing pins of the heat sink by manipulating the elastic clamping clip.

6 Claims, 6 Drawing Sheets

CLIP FOR CLAMPING HEAT SINK AND SEMICONDUCTOR

BACKGROUND OF THE INVENTION

1. Field of the Invention

The present invention relates to a clip for clamping a heat sink and a semiconductor chip together, in which a semiconductor chip such as a CPU of a main board of a computer is coupled with a heat sink by means of the clamping clip, for releasing the generated heat of the semiconductor chip. Particularly, the present invention relates to a clip for clamping a heat sink and a semiconductor chip together, in which a fixing clip having left and right bent portions is used, and the heat sink is elastically fixed to the main board of a computer by means of the clamping clip, so that an external impact cannot cause the heat sink to detached from the main board of the computer.

2. Description of the Prior Art

Generally, a semiconductor chip is installed on a main board of a computer, and a heat sink is installed upon it to dissipate the heat generated from the semiconductor chip. That is, the heat sink is disposed upon the semiconductor chip, and securing pins extend from the bottom of the heat sink to pass through the main board. These pins are fastened by means of a clip, and thus, the heat sink and the semiconductor chip are assembled together.

This know technique of clamping the heat sink and the semiconductor chip is illustrated in FIG. 1. As shown in FIG. 1, upon a main board 10 of a computer, there is installed a semiconductor chip 20. Upon the semiconductor chip 20, there is installed a heat sink 30, but a part of the bottom of the heat sink 30 contacts with the main board 10. From the four corners of the heat sink 30, there extend downward securing pins 40 which pass through the main board 10 to be clamped to a clamping clip 50.

As shown in FIG. 2, each of these conventional clamping clips 50 and 50' has stepped portions 60 on both ends thereof, and the stepped portion 60 has a through hole 70, while an elongate slot 80 is formed integrally with the through hole 70. The two clips 50 and 50' are clamped to the bottom of the heat sink 30.

As shown in FIG. 3, the securing pins 40 are made to pass through the main board 10 into the through holes 70, and then, the clips 50 and 50' are pushed to one side, so that the elongate slots 80 (which has a smaller width than the through hole 70) fix the securing pin 40.

However, in this conventional method, two clamping clips 50 and 50' are used, and therefore, the assembling becomes troublesome, as well as aggravating the workability and productivity.

Further, the securing pins 40 are secured by the elongate slots 80, and therefore, their fixing strengths are extremely weak. Therefore, even under a weak external impact, the clips 50 and 50' are easily loosened, with the result that the heat sink 30 is detached from the main board 10.

SUMMARY OF THE INVENTION

The present invention is intended to overcome the above described disadvantages of the conventional technique.

Therefore it is an object of the present invention to provide a clip for clamping a heat sink and a semiconductor chip, in which a single clip is used in elastically fixing the heat sink and the semiconductor chip to the main board in an easy manner, that is, four pins protruding to under the bottom of the main board are fixed by means of a single clip, thereby realizing a sure and firm fixing.

It is another object of the present invention to provide a clip for clamping a heat sink and a semiconductor chip, in which the clamped state is not easily loosened by an external impact, thereby preventing the heat sink from being detached from the main board.

In achieving the above objects, the clip for clamping a semiconductor chip and a heat sink to a main board according to the present invention includes: a plurality of securing pins extending from a bottom of the heat sink, and having a nodule on a tip of each of them; and a clip for fixing the plurality of the pins, in a state with the heat sink and the semiconductor chip mounted upon the main board. The clip includes: a first fixing part forming a side segment of the clip and having a bent angle of 35–45°; a second fixing part forming another side segment of the clip and having a bent angle of 20–35°; a third fixing part forming a third side segment of the clip and formed between the first and second fixing parts; a pair of semi-circular recesses formed on both ends of the third fixing part for fixing the securing pins of the heat sink; a pair of bent parts formed by being bent from the ends of the first and second fixing parts, for fixing rear securing pins of the heat sink, and having a bent angle of 15–25°; and a handle part formed by being extended from the bent parts.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENT

Figure 1:
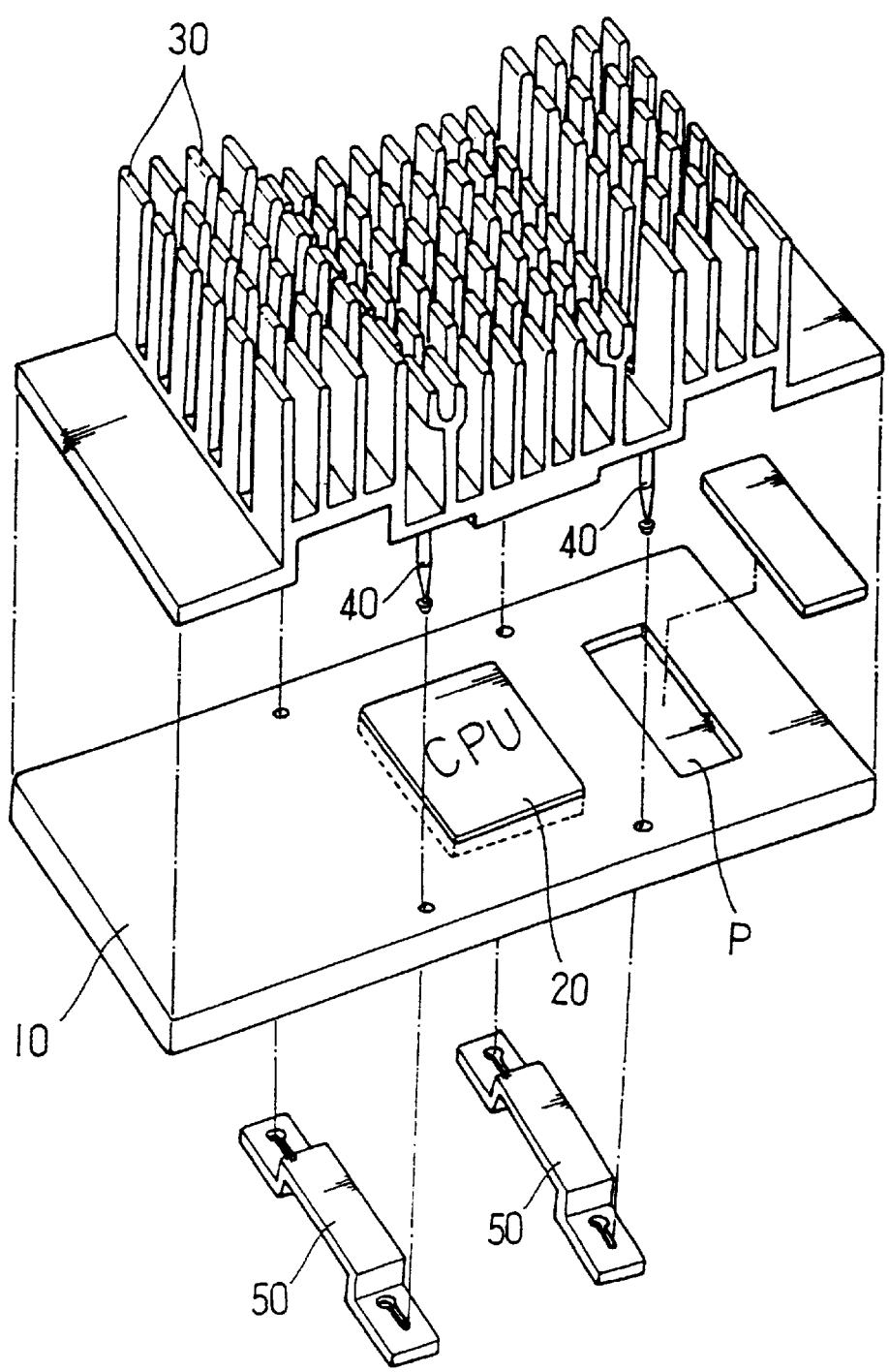
FIG. 1 illustrates the conventional heat sink securing pins, and the clips for fixing the heat sink and the semiconductor chip.
Figure 2:
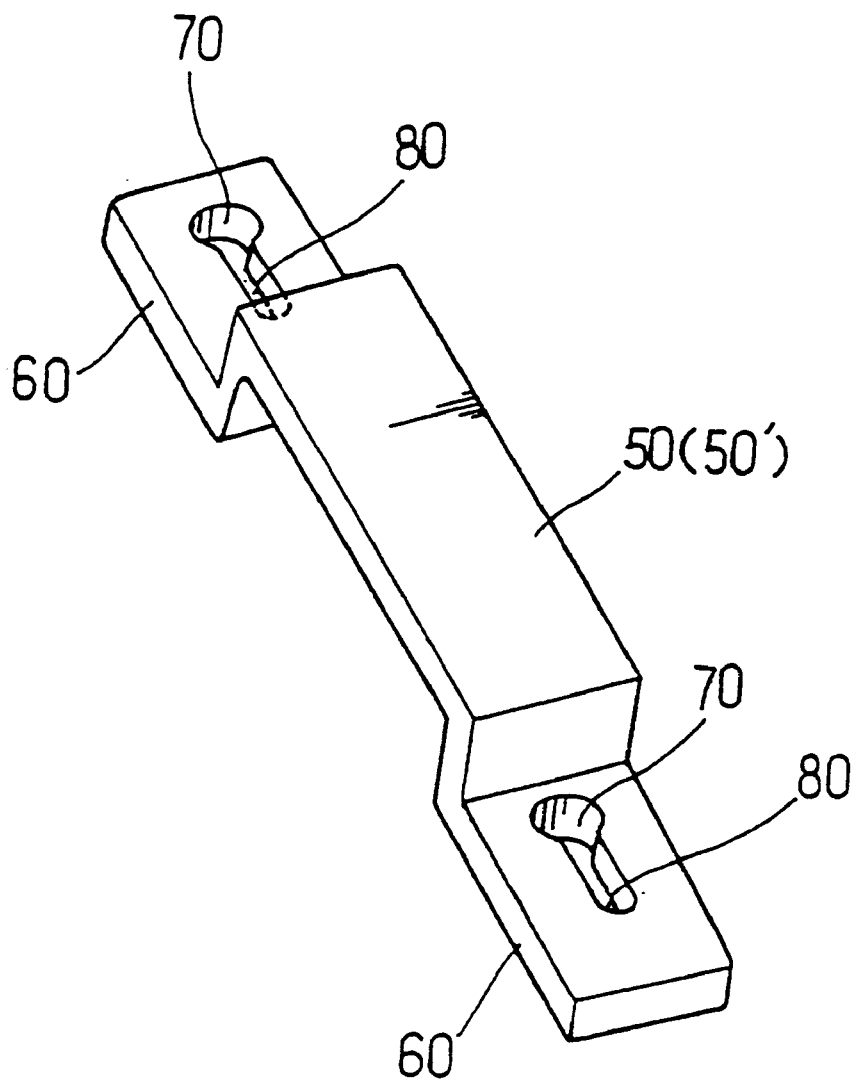
FIG. 2 illustrates the conventional clips for fixing the heat sink and the semiconductor chip.
Figure 3:
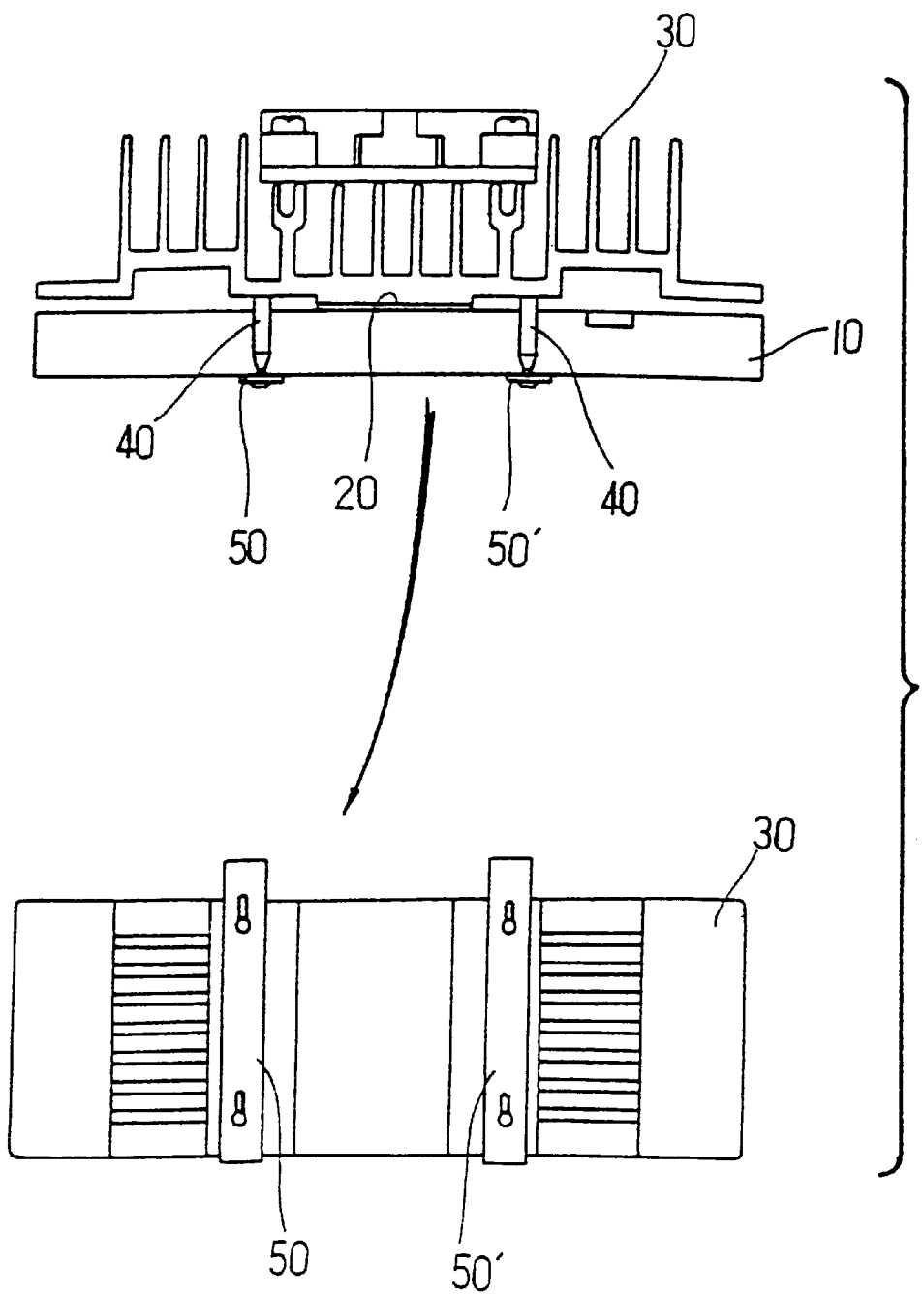
FIG. 3 is a side sectional view showing the assembled state of the heat sink and the semiconductor chip on the main board, the conventional pins and clips being used.
Figure 4:
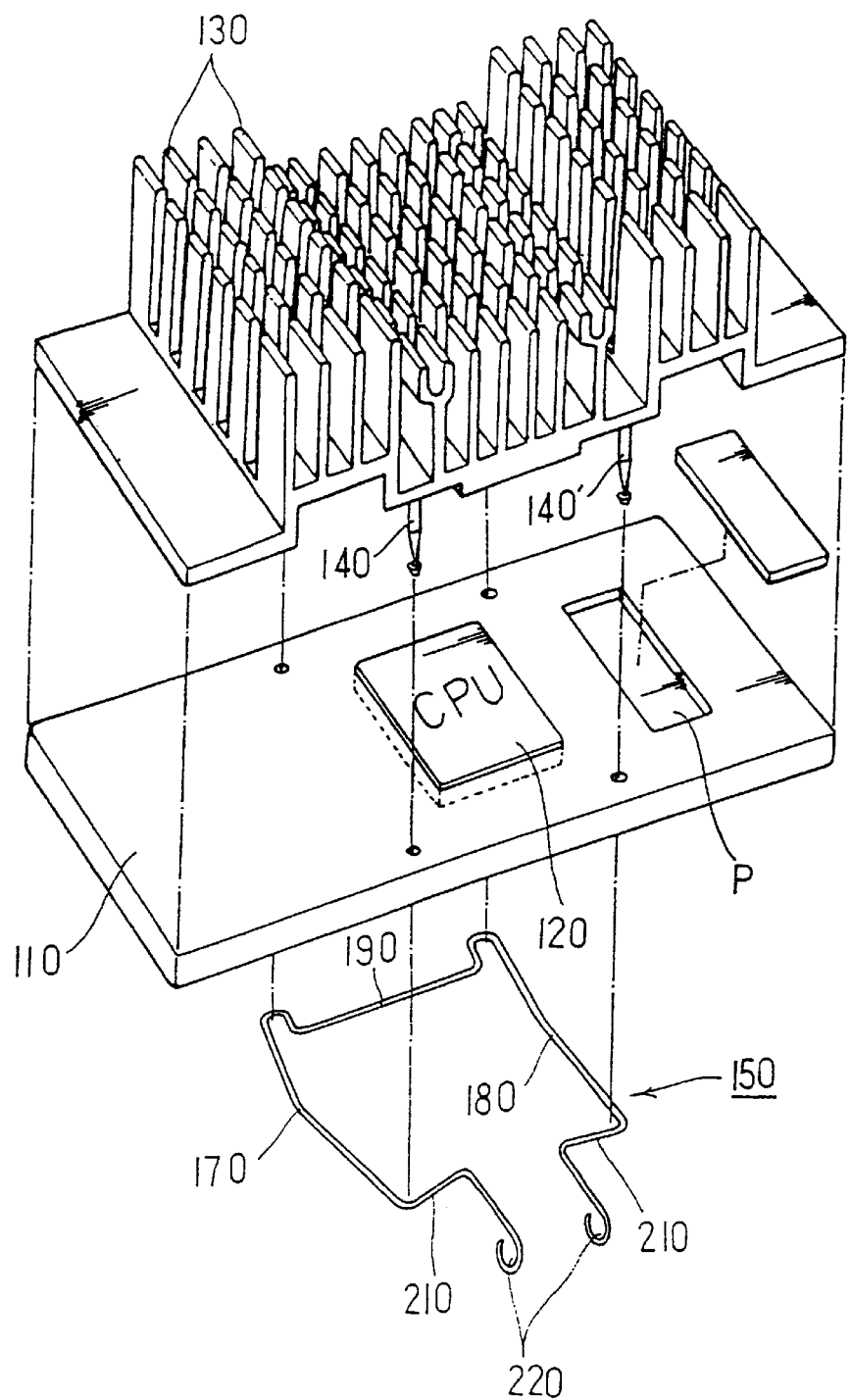
FIG. 4 is an exploded perspective view showing the heat sink and the semiconductor chip mounted on a main board and fixed by using the clip of the present invention.

FIG. 4 is an exploded perspective view showing the heat sink and the semiconductor chip mounted on a main board and fixed by using the clip of the present invention. As shown in this drawing, upon a main board 110 of a computer, there is installed a heat sink 130, with its bottom contacted with the top of a semiconductor chip 120. A plurality of securing pins 140 extends downward from four corners of the heat sink 130 to pass through the main board 110 so as to be clamped by a clip 150.

Figure 5:
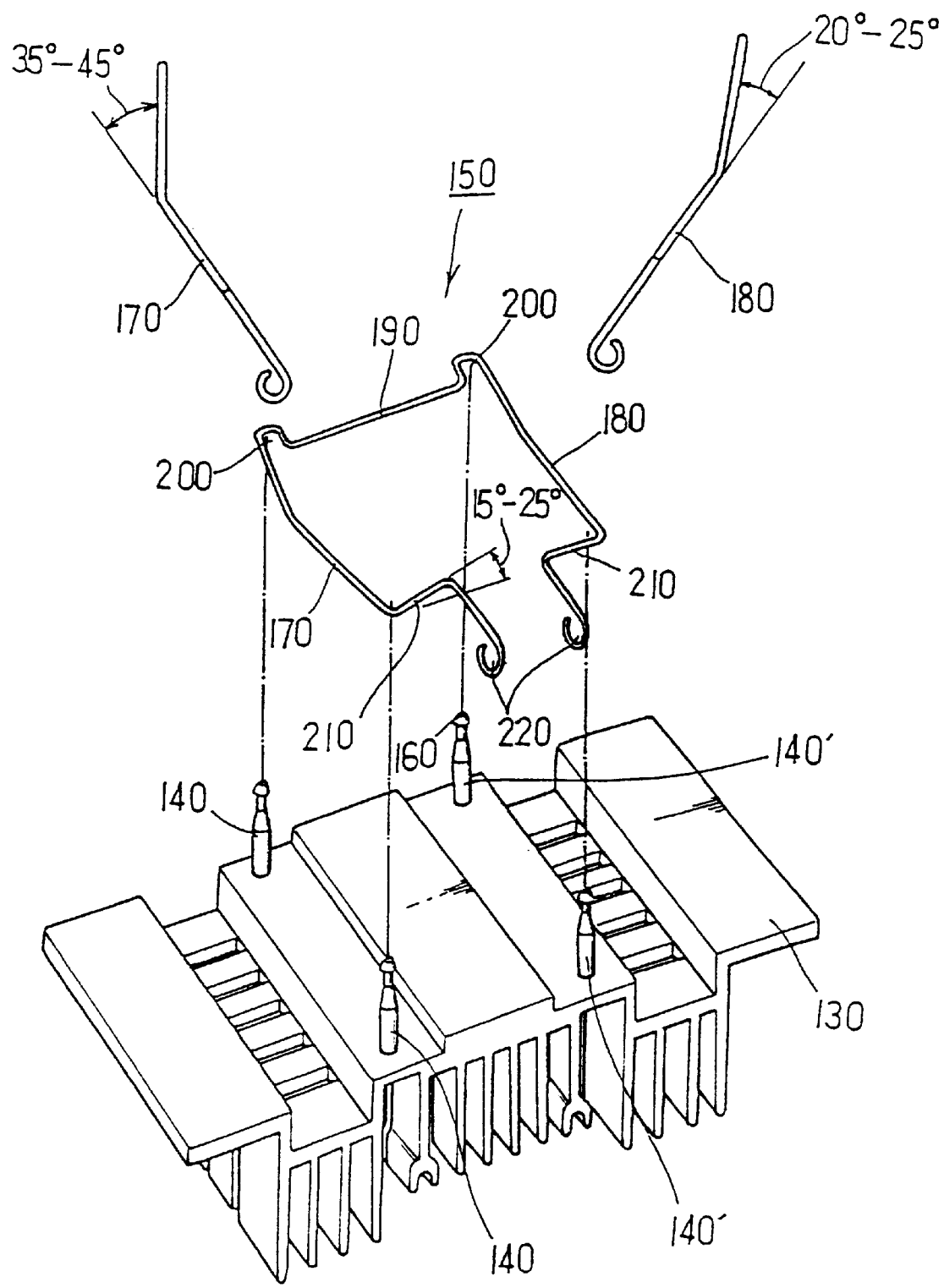
FIG. 5 illustrates the heat sink securing pins and the clip of the present invention.

FIG. 5 illustrates the heat sink securing pins and the clip of the present invention. As shown in this drawing, the plurality of the securing pins protrude from the bottom of the heat sink 130 which is installed upon the main board 110 together with the semiconductor chip 120. The securing pins 140 are integrally formed with the heat sink, and each of the securing pins 140 is provided with a nodule 160 for being engaged with the clamping clip 150. The clamping clip 150 which fixes the four securing pins 140 includes: a first fixing part 170 forming a side segment of the clip 150 and having an bent angle of 35–45 degrees, for fixing the securing pins 140; and a second fixing part 180 forming an opposite side segment of the clip 150 and having a bent angle of 20–35 degrees, for fixing the securing pins 140'.

The clamping clip 150 further includes: a third fixing part 190 formed between the ends of the first and second fixing parts 170 and 180 to connect the first and second fixing parts 170 and 180; a pair of semi-circular fixing recesses 200 formed on both ends of the third fixing part 190 to be engaged with the nodules 160 of the front securing pins 140 and 140'.

The clamping clip 150 further includes: a pair of bent parts 210 formed by being bent from ends of the first and second fixing parts 170 and 180 and having a bent angle of 15–25 degrees, for fixing the rear securing pins 140 and 140'; and a handle 220 formed by being bent from the ends of the bent parts 210, for making the clamping clip 150 expanded and contracted through its manipulations.

The present invention constituted as above will now be described in further detail below.

Figure 6:
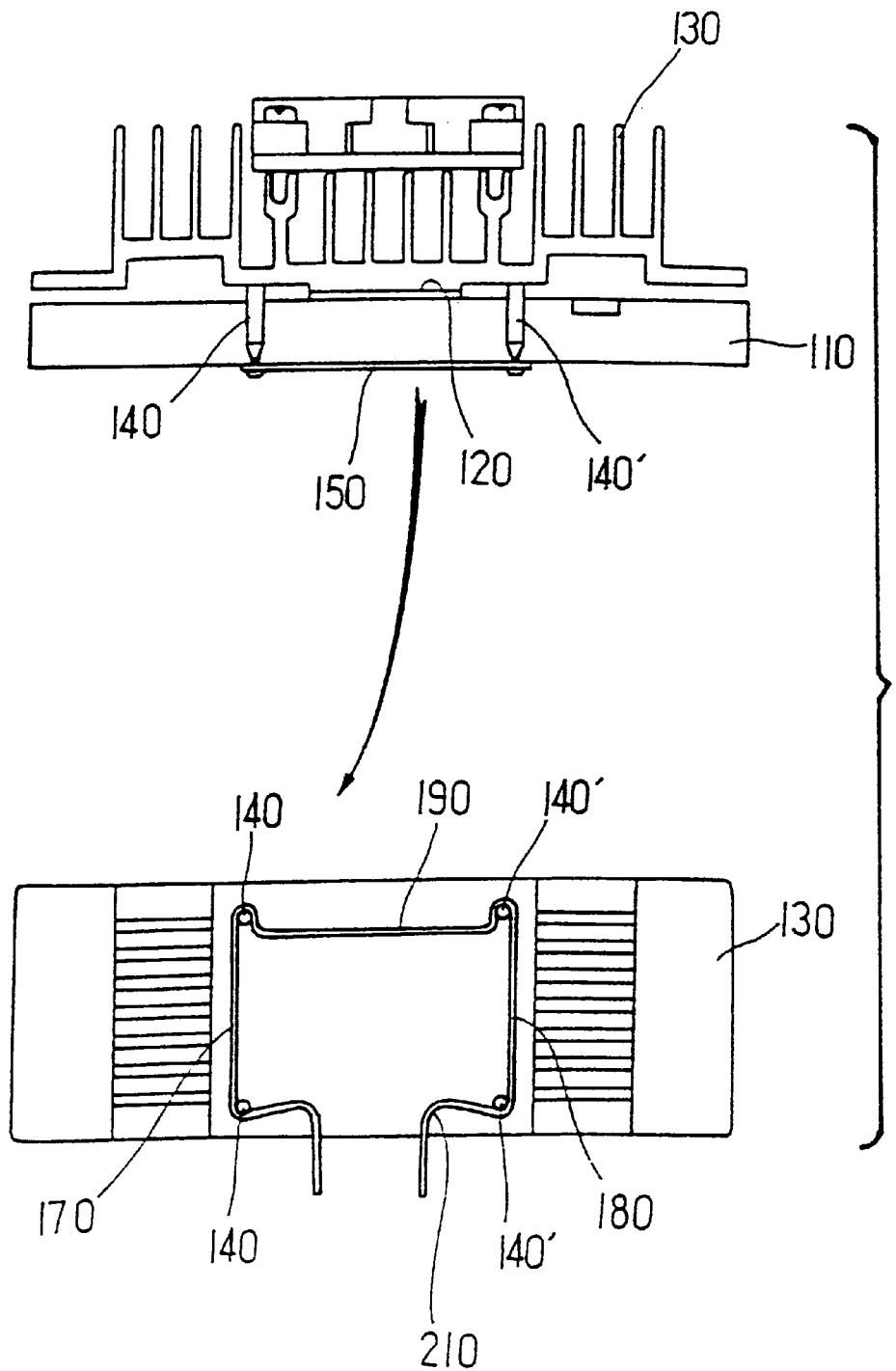
FIG. 6 is a side sectional view showing the heat sink and the semiconductor chip mounted on a main board and fixed by the clip of the present invention.

As shown in FIGS. 4 to 6, in order to release heat from the semiconductor chip 120 which is installed upon the main board 110, the heat sink 130 is installed upon the semiconductor chip 120. The installation of the heat sink 130 is carried out in such a manner that the plurality of the securing pins 140 and 140' are elastically fixed by the clamping clip 150. The clamping clip 150 is made of a wire having a diameter of 1.0–1.5 mm, and therefore, the heat sink 130 can be easily assembled and disassembled to and from the semiconductor chip 120. If the wire of the clamping clip 150 is too thick, then the bending and forming become difficult. If it is too thin (less than 1.0 mm), then the clip 150 cannot give a sufficient elastic force after the forming.

The nodule 160 is formed on the end of each of the securing pins 140 and 140', and therefore, the first fixing part 170 of the clamping clip 150 can fix the securing pins 140. As shown in FIG. 5, the first fixing part 170 has a bent angle of 35–45 degrees.

If the first fixing part 170 of the clamping clip 150 is made to have a bent angle of more than 45 degrees, then the fixing force becomes too strong, with the result that the securing pins 140 cannot be engaged to the clamping clip 150. On the other hand, if the first fixing part 170 of the clamping clip 150 is made to have a bent angle of less than 35 degrees, then the fixing force becomes too weak, with the result that the first fixing part 170 may be easily loosened from the securing pins 140 after their fixing.

Further, if the second fixing part 180 of the clamping clip 150 is made to have a bent angle of more than 35 degrees, then the fixing force becomes too strong, with the result that the securing pins 140' cannot be engaged to the clamping clip 150. On the other hand, if the first fixing part 170 of the clamping clip 150 is made to have a bent angle of less than 20 degrees, then the fixing force becomes too weak, with the result that the first fixing part 170 may be easily loosened from the securing pins 140' after their fixing.

On the portion of the main board 110 where the second fixing part 180 is assembled, there is formed an emblem in the form of recesses P, and therefore, the bent angle of the second fixing part 180 is designed smaller than that of the first fixing part 170.

The third fixing part 190 is formed between the ends of the first and second fixing parts 170 and 180, and a pair of the semi-circular fixing recesses 200 are formed on both ends of the third fixing part 190. Each of the securing pins 140 and 140, is provided with a nodule 160, so that the nodule 160 would be inserted into the semicircular recesses 200.

Further, on rear ends of the first and second fixing parts 179 and 180, there are formed the bent parts 210 having a bent angle of 15–25 degrees, so that they can fix the rear securing pins 140 and 140'. If the bent angle of the bent parts 210 is more than 25 degrees, the other ends of the first and second fixing parts 170 and 180 fix the rear securing pins 140 and 140' with too strong a force. On the other hand, if the bent angle of the bent parts 210 is less than 15 degrees, the opposite ends of the first and second fixing parts 170 and 180 fix the rear securing pins 140 and 140' with too weak a force, with the result that the other ends of the first and second fixing parts 170 and 180 are easily loosened.

Further, a handle part 220 is formed by being bent from the ends of the bent parts 210, so that the clamping clip 150 can be arbitrarily expanded and contracted. By manipulating the handle part 220, the clamping clip 150 can be easily assembled and disassembled to and from the securing pins 140 and 140' of the heat sink 130.

According to the present invention as described above, the clamping clip can be easily assembled and disassembled to and from the heat sink which is installed on the main board of a computer. Further, the heat sink can be more firmly installed by using the securing pins and the clamping clip. Further, the heat sink is elastically fixed by the elastic clamping clip, and therefore, the heat sink will not be detached from the main board under any external impacts.

In the above, the present invention was described based on the specific drawings, but it should be apparent to those ordinarily skilled in the art that various changes and modifications can be added without departing from the spirit and scope of the present invention as defined in the appended claims.

What is claimed is:

1. A clip for clamping a semiconductor chip and a heat sink to a main board, comprising: a plurality of securing pins extending from a bottom of said heat sink, and having a nodule on a tip of each of them; and a clip for fixing the plurality of said pins, in a state with said heat sink and said semiconductor chip mounted upon said main board, said clip comprising:
 a first fixing part forming a side segment of said clip and having a certain bent angle;
 a second fixing part forming another side segment of said clip and having a certain bent angle;
 a third fixing part forming a third side segment of said clip and formed between ends of said first and second fixing parts;
 a pair of semi-circular recesses formed at both ends of said third fixing part, for fixing said front securing pins of said heat sink; and
 a pair of bent parts formed by being bent from said first and second fixing parts, for fixing said rear securing pins of said heat sink, and having a certain bent angle.

2. The clip as claimed in claim 1, wherein said clamping clip is made of a wire having a diameter of 1.0–1.5 mm.

3. The clip as claimed in claim 1, wherein said first fixing part has a bent angle of 35–45 degrees.

4. The clip as claimed in claim 1, wherein said second fixing part has a bent angle of 20–35 degrees.

5. The clip as claimed in claim 1, wherein each of said bent parts has a bent angle of 20–35 degrees.

6. The clip as claimed in claim 1, further comprising a handle part formed by being extended from said bent parts.

* * * * *

UNITED STATES PATENT AND TRADEMARK OFFICE
CERTIFICATE OF CORRECTION

PATENT NO. : 6,101,091
DATED : August 8, 2000
INVENTOR(S) : Gerald Tolin

It is certified that error appears in the above-identified patent and that said Letters Patent is hereby corrected as shown below:

Column 1 Line 16 "to detached" should read --to detach--.

Column 1 Line 27 "This know" should read --This known--.

Column 4 Line 1 after "and" delete "140," and insert --140'--.

Signed and Sealed this

Twenty-fourth Day of April, 2001

Attest:

NICHOLAS P. GODICI

Attesting Officer

Acting Director of the United States Patent and Trademark Office